(12) United States Patent
Venugopal et al.

(10) Patent No.: US 10,771,033 B2
(45) Date of Patent: Sep. 8, 2020

(54) ELECTRICAL FEED LINE INTEGRATED FILTERING FOR INDUCTIVE POWER TRANSFER SYSTEMS

(71) Applicant: WiTricity Corporation, Watertown, MA (US)

(72) Inventors: Prasanth Venugopal, Munich (DE); Martin Pavlovsky, Munich (DE); Nicholas Athol Keeling, Munich (DE); Stefan Raabe, Unterhaching (DE); Daniel Kuerschner, Grasbrunn (DE); Roman Heinrich, Munich (DE); Simon Islinger, Munich (DE)

(73) Assignee: WiTricity Corporation, Watertown, MA (US)

( * ) Notice: Subject to any disclaimer, the term of this patent is extended or adjusted under 35 U.S.C. 154(b) by 177 days.

(21) Appl. No.: 16/011,845

(22) Filed: Jun. 19, 2018

(65) Prior Publication Data
US 2019/0386628 A1 Dec. 19, 2019

(51) Int. Cl.
*H03H 7/01* (2006.01)
*H02J 50/10* (2016.01)
(Continued)

(52) U.S. Cl.
CPC ............ *H03H 7/0115* (2013.01); *B60L 53/12* (2019.02); *B60L 53/122* (2019.02); *H02J 50/10* (2016.02);
(Continued)

(58) Field of Classification Search
CPC ........ H03H 7/0115; H02J 50/10; H02J 50/12; B60L 53/12; B60L 53/20; B60L 53/122; H02M 1/126
(Continued)

(56) References Cited

U.S. PATENT DOCUMENTS

| 5,627,501 A * | 5/1997 | Biran ........................ H04L 5/06 333/126 |
| 2015/0064970 A1 | 3/2015 | Low et al. |
| 2015/0094887 A1 | 4/2015 | Kawashima |

FOREIGN PATENT DOCUMENTS

WO 2015083531 6/2015

OTHER PUBLICATIONS

Machine translation of international patent application publication WO 2015/083531 (Takemura), published Nov. 6, 2015. (Year: 2015).*

(Continued)

*Primary Examiner* — Hal Kaplan
(74) *Attorney, Agent, or Firm* — Colby Nipper PLLC (57) ABSTRACT

Certain aspects of the present disclosure are generally directed to apparatus for attenuating unwanted frequencies using a feed line with integrated filtering. In certain aspects, a feed line for filtering unwanted frequencies in a wireless power transfer system is provided, the feed line including a first end, wherein the first end is configured to connect to a power source that generates a driving signal having a driving signal frequency, and a second end, wherein the second end is configured to connect to a wireless power transfer element configured to wirelessly transmit power. The feed line further includes a conductor core, wherein the conductor core is configured to transfer the driving signal from the power source to the wireless transfer element. The feed line further includes an integrated filter configured to attenuate at least one frequency generated by the wireless power transfer system.

20 Claims, 9 Drawing Sheets

(51) Int. Cl.
  *B60L 53/12*  (2019.01)
  *B60L 53/122*  (2019.01)
  *B60L 53/20*  (2019.01)
  *H02M 1/12*  (2006.01)
  *H02J 50/12*  (2016.01)

(52) U.S. Cl.
  CPC .............. *H02J 50/12* (2016.02); *H02M 1/126* (2013.01); *B60L 53/20* (2019.02)

(58) Field of Classification Search
  USPC ........................................................ 307/104
  See application file for complete search history.

(56) References Cited

OTHER PUBLICATIONS

"International Search Report and Written Opinion", PCT Application No. PCT/US2019/032941, dated Jul. 17, 2019, 13 pages.

\* cited by examiner

ELECTRICAL FEED LINE INTEGRATED FILTERING FOR INDUCTIVE POWER TRANSFER SYSTEMS

TECHNICAL FIELD

The present disclosure relates generally to filtering frequencies in inductive power transfer (IPT) systems, and in particular to filtering unwanted frequencies using a feed line with integrated filtering to attenuate one or more frequencies in a wireless charging power transfer device.

BACKGROUND

Electrical charging systems are increasing in complexity, power delivery, and other features, such as wireless charging. Remote systems, such as vehicles, include locomotion power derived from electricity received from an energy storage device, such as a battery. For example, hybrid electric vehicles include on-board chargers that use power from vehicle braking, traditional motors, and other innovations to charge power storage units in vehicles. Vehicles that are solely electric generally receive electricity for charging its batteries from additional sources, for example a wired alternating current (AC) such as household or commercial AC supply through a power outlet connected to a power grid. The wired charging connections cables are physically connected to a power supply. Wireless power charging systems that are capable of transferring power in free space (e.g., via a wireless field) overcome some of the deficiencies of wired charging solutions to charge electric vehicles. As such, wireless power charging systems and methods that efficiently and safely transfer power for charging electric vehicles are desirable.

Inductive power transfer (IPT) systems are one means for the wireless transfer of energy. In IPT, a primary (or "base") power device (e.g., a base pad, wireless power transfer pad, a wireless power transfer element, base wireless charging system, or some other wireless power transfer device including a power transfer element (e.g., base power transfer element)) transmits power to a secondary (or "pick-up") power receiver device (e.g., a vehicle pad, an electric vehicle wireless charging unit, or some other wireless power receiving device including a power transfer element (e.g., vehicle power transfer element)). Each of the transmitter and receiver power devices includes inductors, typically coils or windings of electric current conveying media. An alternating current in the primary inductor produces a fluctuating magnetic field. When the secondary inductor is placed in proximity to the primary inductor, the fluctuating magnetic field induces an electromotive force (EMF) in the secondary inductor, thereby transferring power to the secondary power receiver device.

For example, in wireless electric vehicle charging (WEVC) systems, the alternating current in the primary inductor is commonly supplied by a pulse width modulated (PWM) inverter connected to a power source to supply a square wave voltage through a cable (or "feed line") to a base power transfer element. The base power transfer element includes resonant tank circuitry (e.g., circuitry comprising a combination of a capacitance component (C) and an inductance component (L)) configured to operate a resonant frequency using any number of compensation strategies. For example, compensation strategies such as LC, LCL, SS, SP, PS, and PP are widely adopted, where the first S (series) or P (parallel) represents a capacitor in series or parallel, respectively, with a transmitter coil and the second S or P stands for capacitor in series or parallel, respectively, with the receiver coil. It will be appreciated that other compensation strategies are within the scope of the disclosure. Accordingly, in some embodiments, the square wave is generated at the resonant frequency of the resonant tank circuitry.

The square wave voltage supplied to the base power transfer element may lead to unwanted frequencies (e.g., harmonic frequencies) being generated in the WEVC system including at the base power transfer element and at a vehicle power transfer element wirelessly coupled to the base power transfer element, as well as at other components coupled thereto. Such unwanted harmonics may lead to undesired non-sinusoidal currents and voltages in components of the WEVC. For example, even though an LCL compensation strategy generally serves to deliver uninterrupted power and smoother power transitions, the resonant tank circuitry and/or other components of a wireless power transfer device including the base power transfer element may reflect reactive power back towards the power source through the feed line causing efficiency losses and heat. Accordingly, these unwanted harmonics reduce system efficiency (e.g., due to hysteresis and eddy current losses). Further, the heat generated can degrade the base power transfer element including system capacitors and other components resulting in long-term reliability issues, EMI safety concerns, and poor performance.

Designers of IPT systems are often under continual pressure to make smaller, lighter, and generally more compact IPT systems and/or to adapt IPT systems to certain design criteria (e.g., parking lot dimensions for a WEVC system). Adding additional circuitry to the base power transfer element or the power supply to reduce unwanted frequencies in an IPT system may add size and complexity where space is at a premium. Thus there is a need in the art for improvements to IPT frequency filtering.

SUMMARY

In certain aspects, (e.g., in a WEVC system) a component connecting a power supply to a base power transfer element is a feed line. A feed line in a WEVC system is commonly three to six meters in length. In certain aspects, a feed line may be less than three meters in length or even less than a meter in length. In other aspects, a feed line may be more than six meters in length (e.g., a feed line in a parking garage may be tens of meters in length or hundreds of meters in length). A feed line typically has a capacitance and an inductance when driven by signals (e.g., by a PWM square wave voltage) having one or more frequencies. For example, a feed line in a WEVC system typically has an inductance of about 0.5-1 µH per meter when driven by a square wave voltage source at approximately 85 kHz. The properties of a feed line are dependent on several elements including the frequency of a signal driven over the feed line (e.g., referred to herein as a driving signal frequency), the base power transfer element including the type of coil, coil configuration, material properties, and etc. to name a few. In certain aspects, a feed line is integrated with filter components (e.g., capacitors, inductors, dielectric materials, and etc.) to filter (or attenuate) unwanted frequencies. While the discussion may focus on a wireless power transfer device in the context of a WEVC system, it will be appreciated that the innovations disclosed herein pertain to any wireless power transfer device that incorporates a feed line without deviating from the scope of the disclosure. For example, a smartphone using a wireless power transfer device to charge its batteries may also benefit from the innovations described herein as it may be desirable to use a feed line with integrated filtering to filter unwanted frequencies.

Certain aspects of the present disclosure are directed to a feed line for filtering unwanted frequencies in a wireless power transfer system. The feed line including a first end, wherein the first end is configured to connect to a power source that generates a driving signal having a driving signal frequency. The feed line further including a second end, wherein the second end is configured to connect to a wireless power transfer element configured to wirelessly transmit power. The feed line further including at least one conductor core, wherein the conductor core is configured to transfer the driving signal from the power source to the wireless power transfer element. The feed line further comprising an integrated filter configured to attenuate at least one frequency generated by the wireless power transfer system, wherein the integrated filter includes at least one inductor and at least one capacitor.

Certain aspects of the present disclosure are directed to a wireless power transmitter system for filtering unwanted frequencies in a wireless power transfer system. The wireless power transmitter system including a power source that generates a driving signal having a driving signal frequency. The wireless power transmitter system further including a feed line connected to the power source at a first end. The feed line in the wireless power transmitter system further including at least one conductor core. The feed line in the wireless power transmitter system further including an integrated filter configured to attenuate at least one frequency generated by the wireless power transfer system when a wireless power transfer element is coupled to a second end of the feed line, wherein the integrated filter includes at least one inductor and at least one capacitor.

Certain aspects of the present disclosure are directed to a wireless power receiver system for filtering unwanted frequencies in a wireless power transfer system. The wireless power receiver system including a wireless power transfer element configured to wirelessly transmit power when driven by a power source that generates a driving signal having a driving signal frequency. The wireless power receiver system further including a feed line connected to the wireless power transfer element at a first end. The feed line in the wireless power receiver system further including at least one conductor core and an integrated filter configured to attenuate at least one frequency generated by the wireless power transfer system, wherein the integrated filter includes at least one inductor and at least one capacitor.

Other aspects, features, and embodiments of the present disclosure will become apparent to those of ordinary skill in the art, upon reviewing the following description of specific, exemplary aspects of the present disclosure in conjunction with the accompanying figures. While features of the present disclosure may be discussed relative to certain aspects and figures below, all aspects of the present disclosure can include one or more of the advantageous features discussed herein. In other words, while one or more aspects may be discussed as having certain advantageous features, one or more of such features may also be used in accordance with the various aspects of the present disclosure. In similar fashion, while exemplary aspects may be discussed below as a device, system, or method aspects it should be understood that such exemplary aspects can be implemented in various devices, systems, and methods.

The following detailed description and accompanying drawings provide a better understanding of the nature and advantages of the present disclosure

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. In the accompanying drawings.

DETAILED DESCRIPTION

The detailed description set forth below in connection with the appended drawings is intended as a description of exemplary implementations and is not intended to represent the only implementations in which the invention may be practiced. The term "example," or "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form.

Wirelessly transferring power may refer to transferring any form of energy associated with electric fields, magnetic fields, electromagnetic fields, or otherwise from a transmitter to a receiver (e.g., power is transferred through free space). The power output into a wireless field (e.g., a magnetic field) may be received, captured by, or coupled by a "receiving coil" to achieve power transfer. An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include, besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as smartphones, personal computing devices, and etc.).

Figure 1:
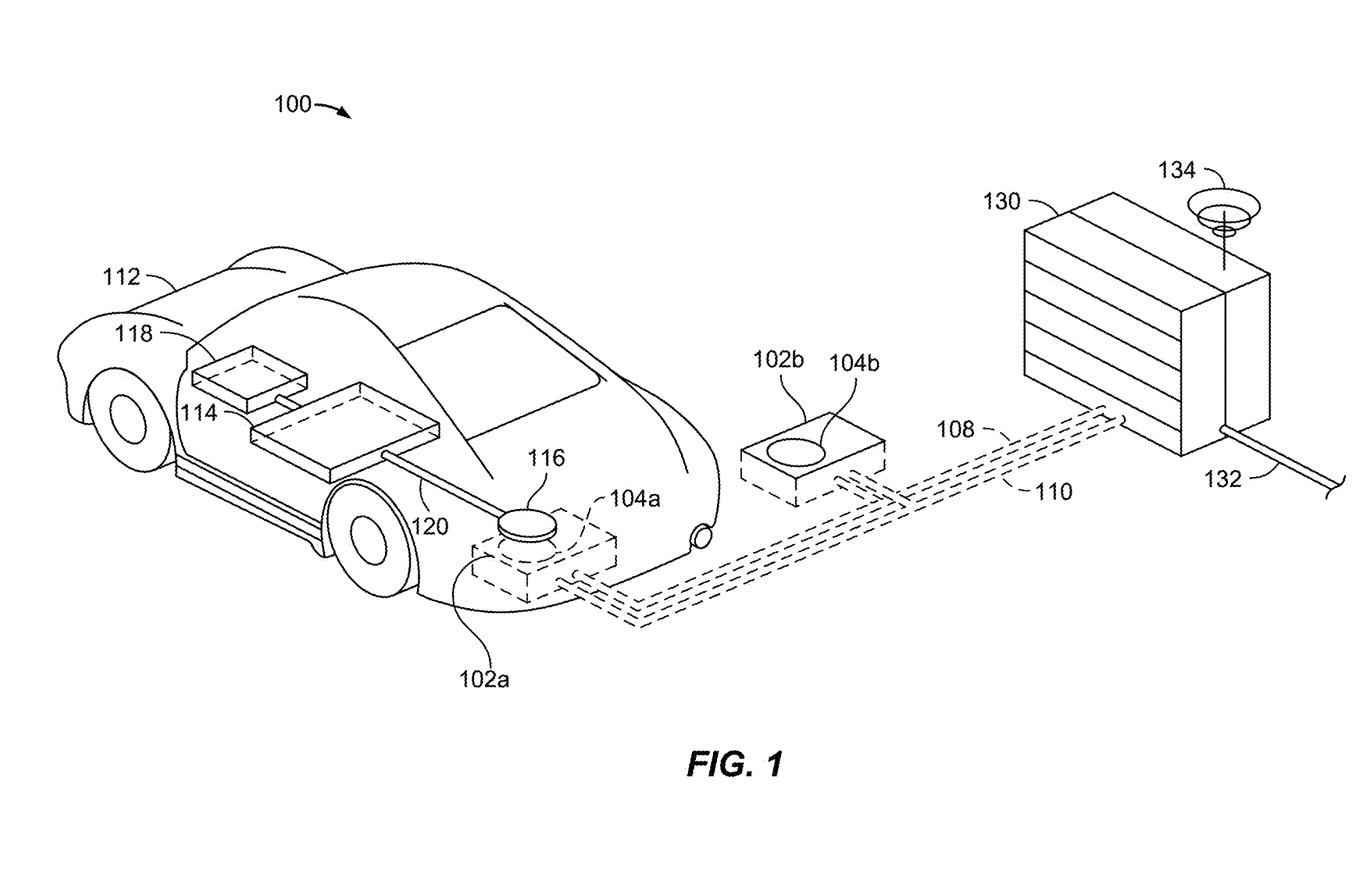
FIG. 1 illustrates a wireless power transfer system for charging an electric vehicle, in accordance with certain aspects of the present disclosure.

FIG. 1 is a diagram of an exemplary wireless power transfer system 100 for charging an electric vehicle, in accordance with certain aspects of the disclosure. The wireless power transfer system 100 enables charging of an electric vehicle 112 while the electric vehicle 112 is parked so as to efficiently couple with a base wireless charging system 102a. Parking spaces for two electric vehicles are illustrated in a parking area corresponding to base wireless charging systems 102a and 102b. In some implementations, a local power source 130, may be connected to a power backbone 132 (e.g., an AC mains) and to the base wireless charging systems 102a and 102b through feed line 110. Each of the base wireless charging systems 102a and 102b also include a base power transfer element 104a and 104b for wirelessly transferring power to vehicle 112. In other implementations (not shown in FIG. 1), base power transfer elements 104a or 104b may be stand-alone physical units and are not part of the base wireless charging system 102a or 102b. In yet other implementations (not shown in FIG. 1), local power source 130 and feed line 110 may be integrated into base wireless charging system 102a or 102b. Local power source 130 may be configured to communicate with external sources (e.g., a power grid) via a communication backhaul 134, and with components of the base wireless charging system 102 via a communication link 108.

The electric vehicle 112 includes an electric vehicle power transfer element 116 connected to an electric vehicle wireless charging unit 114 by feed line 120. The electric vehicle 112 further includes a battery unit 118 connected to the electric vehicle wireless charging unit 114. In some diagrams shown herein, the electric vehicle wireless charging unit 114 is also referred to as the vehicle charging unit (VCU). The electric vehicle power transfer element 116 can interact with the base power transfer element 104a for example, via a region of the electromagnetic field generated by the base power transfer element 104a.

In certain aspects, the electric vehicle power transfer element 116 receives power when the electric vehicle power transfer element 116 is located in an electromagnetic field produced by the base power transfer element 104a. The field corresponds to a region where energy output by the base power transfer element 104a may be received by the electric vehicle power transfer element 116. For example, the energy output by the base power transfer element 104a may be at a level sufficient to charge or power the electric vehicle 112. In some cases, the field may correspond to a "near-field" of the base power transfer element 104a. The near-field may correspond to a region in which there are strong reactive fields resulting from the currents and charges in the base power transfer element 104a that do not radiate power away from the base power transfer element 104a. In some cases the near-field corresponds to a region around base power transfer element 104a that is within about $1/2\pi$ of a wavelength of a frequency of an electromagnetic field produced by the base power transfer element 104a.

The electric vehicle power transfer element 116 and base power transfer element 104 may be configured or referred to as "loop" antennas, and more specifically, multi-turn loop antennas. Loop (e.g., multi-turn loop) antennas may be configured to include an air core or a physical core such as a ferrite core. An air core loop antenna may allow the placement of other components within the core area. Physical core antennas including ferromagnetic materials may allow development of a stronger electromagnetic field and improved coupling. The elements 104 and 116 may also be configured or referred to as "magnetic" antennas. The term "power transfer element" is intended to refer to a component that may wirelessly output or receive energy for coupling to another "power transfer element." The power transfer element may also be referred to as an "antenna" or a "coupler" of a type that is configured to wirelessly output or receive power. As used herein, power transfer elements 104 and 116 are examples of power transfer elements of a type that are configured to wirelessly output, wirelessly receive, and/or wirelessly relay power.

In some implementations, the electric vehicle power transfer element 116 may be aligned with the base power transfer element 104a and, therefore, disposed within a near-field region simply by the electric vehicle operator positioning the electric vehicle 112 such that the electric vehicle power transfer element 116 is sufficiently aligned relative to the base power transfer element 104a. Alignment may be considered sufficient when an alignment error has fallen below a tolerable value. In other implementations, the operator may be given visual and/or auditory feedback to determine when the electric vehicle 112 is properly placed within a tolerance area for wireless power transfer. In yet other implementations, the electric vehicle 112 may be positioned by an autopilot system, which may move the electric vehicle 112 until the sufficient alignment is achieved. This may be performed automatically and autonomously by the electric vehicle 112 with or without driver intervention. This may be possible for an electric vehicle 112 that is equipped with a servo steering, radar sensors (e.g., ultrasonic sensors), and intelligence for safely maneuvering and adjusting the electric vehicle. In still other implementations, the electric vehicle 112 and/or the base wireless charging system 102a may have functionality for mechanically displacing and moving the power transfer elements 116 and 104a, respectively, relative to each other to more accurately orient or align them and develop sufficient and/or otherwise more efficient coupling.

The base wireless charging system 102a may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment. Base wireless charging system 102 may also be capable of locating itself under the electric vehicle power transfer element 116 so that electric vehicle power transfer element 116 is sufficiently aligned relative to the base power transfer element 104.

Charging electric vehicles wirelessly may provide numerous benefits. For example, charging may be performed automatically, virtually without driver intervention or manipulation thereby improving convenience to a user. There may also be no exposed electrical contacts and no mechanical wear out, thereby improving reliability of the wireless power transfer system 100. Safety may be improved since manipulations with cables and connectors may not be needed and there may be no cables, plugs, or sockets to be exposed to moisture in an outdoor environment. In addition, there may also be no visible or accessible sockets, cables, or plugs, thereby reducing potential vandalism of power charging devices. Further, since the electric vehicle 112 may be used as distributed storage devices to stabilize a power grid, a convenient docking-to-grid solution may help to increase availability of vehicles for vehicle-to-grid (V2G) operation.

The wireless power transfer system 100 as described with reference to FIG. 1 may also provide aesthetical and non-impedimental advantages. For example, there may be no charge columns and cables that may impede vehicles and/or pedestrians.

As a further explanation of the vehicle-to-grid capability, the wireless power transmit and receive capabilities may be configured to be reciprocal such that either the base wireless charging system 102a can transmit power to the electric vehicle 112 or the electric vehicle 112 can transmit power to the base wireless charging system 102a. This capability may be useful to stabilize the power distribution grid by allowing electric vehicles 112 to contribute power to the overall distribution system in times of energy shortfall caused by over demand or shortfall in renewable energy production (e.g., wind or solar). In doing so, power would be drawn from battery 118, and vehicle electric charging unit 114 would generate a charging frequency to power electric vehicle power transfer element 116 through feed line 120.

Figure 2:
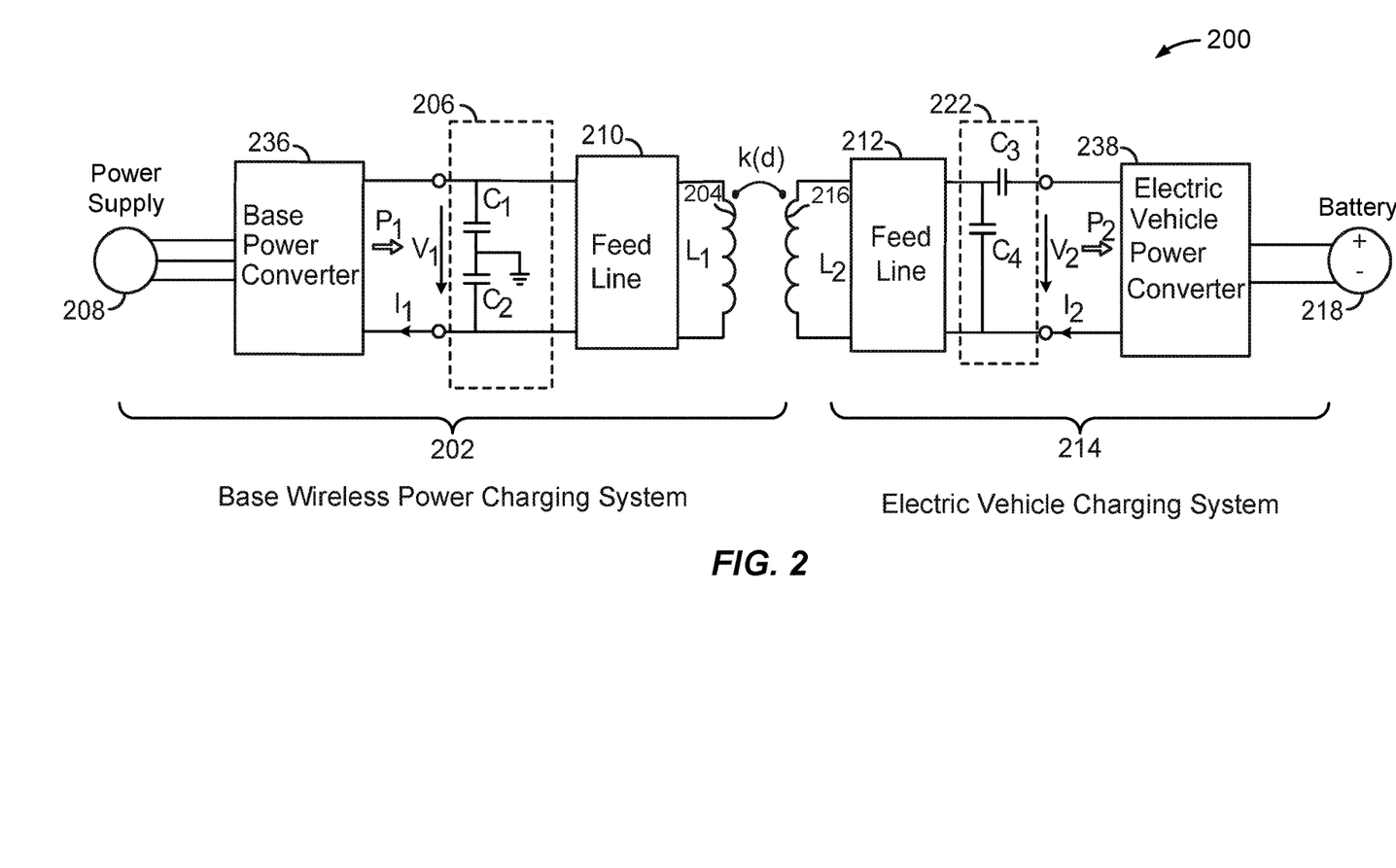
FIG. 2 is a schematic diagram of exemplary components of the wireless power transfer system, in accordance with certain aspects of the present disclosure.

FIG. 2 is a schematic diagram in accordance with certain aspects of the disclosure. Wireless power transfer system 200 may be a WEVC system (e.g., wireless power transfer system 100 in FIG. 1). The base wireless power charging system 202 includes a power supply 208, a base power converter 236, a compensation network 206, a feed line 210, and a base power transfer element 204 having an inductance L1. The electric vehicle charging system 214 includes an electric vehicle power transfer element 216 having an inductance L2, a feed line 212, a compensation network 222, an electric vehicle power converter 238, and a battery 218. Implementations described herein may use capacitively loaded conductor loops (i.e., multi-turn coils) forming a resonant structure that is capable of efficiently coupling energy from a primary structure (transmitter) to a secondary structure (receiver) via a magnetic or electromagnetic near-field if both the transmitter and the receiver are tuned to a common resonant frequency. The coils may be used for the electric vehicle power transfer element 216 and the base power transfer element 204. Using resonant structures for coupling energy may be referred to as "magnetically coupled resonance," "electromagnetically coupled resonance," and/or "resonant induction." In certain aspects, energy may be transferred in the reverse direction (e.g., from battery 218 to power supply 208).

Power supply 208, which supplies power (e.g., AC or DC), is connected to base power converter 236 and compensation network 206 to transfer energy through feed line 210 and base power transfer element 204 to transfer energy to an electric vehicle charging system 214 (e.g., electric vehicle 112 of FIG. 1). In certain aspects, power supply 208 is a single phase AC power supply or a polyphase AC power supply (e.g., a three phase power supply) that may be a power factor corrected (PFC) power supply. In certain aspects, compensation network 206 is integrated into base power converter 236 or located on the other side of feed line 210 between feed line 210 and base power transfer element 204. In certain aspects, compensation network 206 is integrated into base power transfer element 204. In certain aspects, other compensation network configurations (e.g., LC, LCL, SS, SP, PS, PP, etc.) are used. In certain aspects, feed line 210 is a feed line with integrated filtering as described in the disclosure. It will be appreciated that there may be more than one feed line transferring power from base power converter 236. In certain aspects, power supply 208 may supply one base power converter 236, and base power converter 236 may be connected to more than one base power transfer element 204, each with its own, or shared, feed line. It will be further appreciated that more than one power supply may be used to supply power to base power transfer element 204.

Base power converter 236 may include circuitry such as an AC-to-DC converter configured to convert power from standard mains AC (e.g. two phase, three phase, and etc.) to DC power at a suitable voltage level, and a DC-to-low frequency (LF) converter configured to convert DC power to power at an operating frequency suitable for wireless high power transfer. The base power converter 236 supplies power P1 to the base resonant circuit comprising compensation network 206 and power transfer element 204 (L1). This compensation network 206 and power transfer element 204 (L1) should be construed as exemplary. In yet other implementations, tuning may be formed of several reactive elements in any combination of parallel or series topologies. The capacitors C1 and C2 may be provided to form a resonant circuit with the base power transfer element 204 that resonates substantially at the operating frequency. The base power transfer element 204 receives the power P1 through a feed line 210 and wirelessly transmits power at a level sufficient to charge or power the electric vehicle. For example, the level of power provided wirelessly by the base power transfer element 204 may be on the order of kilowatts (kW) (e.g., anywhere from 1 kW to 110 kW, although actual levels may be or higher or lower).

The base resonant circuit (comprising the base power transfer element 204 and the compensation network 206) and the electric vehicle resonant circuit (including the electric vehicle power transfer element 216 and compensation network 222) may be tuned to substantially the same frequency. The electric vehicle power transfer element 216 may be positioned within the near-field of the base power transfer element and vice versa, as further explained below. In this case, the base power transfer element 204 and the electric vehicle power transfer element 216 may become coupled to one another such that power may be transferred wirelessly from the base power transfer element 204 to the electric vehicle power transfer element 216. The series capacitor C3 and the parallel capacitor C4 in compensation network 222 may be provided to form a resonant circuit with the electric vehicle power transfer element 216 that resonates substantially at the operating frequency. The compensation network 222 should be construed as being exemplary. In certain aspects other compensation networks (e.g., LC, LCL, SS, SP, PS, PP, etc.) are used. Element k(d) represents the mutual coupling coefficient resulting at coil separation d. It will be appreciated that losses may be inherent to the base and electric vehicle power transfer elements 204 and 216 and the tuning (anti-reactance) capacitors C1/C2 and C3/C4, respectively. The electric vehicle resonant circuit, including the electric vehicle power transfer element 216 and compensation network 222, receives and provides the power P2 through a feed line 212 to an electric vehicle power converter 238 of an electric vehicle charging system 214. In certain aspects, feed line 212 is a feed line with integrated filtering as described in the disclosure.

The electric vehicle power converter 238 may include, among other things, a LF-to-DC converter configured to convert power at an operating frequency back to DC power at a voltage level to charge electric vehicle battery unit 218. The power supply 208, base power converter 236, compensation network 206, feed line 210, and base power transfer element 204 may be configured into a single unit. The electric vehicle battery 218, electric vehicle power converter 238, compensation network 222, feed line 212, and electric vehicle power transfer element 216 may be included in the electric vehicle charging system 214 that is part of the electric vehicle (e.g., electric vehicle 112 in FIG. 1) or integrated into a removable unit or battery pack (not shown). The electric vehicle charging system 214 may also be configured to provide power wirelessly through the electric vehicle power transfer element 216 to the base wireless power charging system 202 to feed power back to the grid. Each of the electric vehicle power transfer element 216, feed line 212, compensation network 222, and the base power transfer element 204 may act as transmit or receive power transfer elements based on the mode of operation.

While not shown, the wireless power transfer system 200 may include a load disconnect unit (LDU) to disconnect load 218 or power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle power transfer element 216 to the electric vehicle power converter 238. Disconnecting the electric vehicle power transfer element 216 may suspend charging and also may change the "load" as "seen" by the base wireless power charging system 202 (acting as a transmitter), which may be used to "cloak" the electric vehicle charging system 214 (acting as the receiver) from the base wireless power charging system 202. The load changes may be detected if the transmitter includes a load sensing circuit. Accordingly, the transmitter, such as the base wireless power charging system 202, may have a mechanism for determining when receivers, such as the electric vehicle charging system 214, are present in the near-field coupling mode region of the base power transfer element 204 as further explained below.

As described above, in operation, during energy transfer towards an electric vehicle (e.g., electric vehicle 112 of FIG. 1), input power is provided from the power supply 208 such that the base power transfer element 204 generates an electromagnetic field for providing the energy transfer. The electric vehicle power transfer element 216 couples to the electromagnetic field and generates output power for storage or consumption by the electric vehicle 112. As described above, in certain aspects, the base resonant circuit and electric vehicle resonant circuit are configured and tuned using compensation network 206 and compensation network 222 according to a mutual resonant relationship such that they are resonating nearly or substantially at the operating frequency. Transmission losses between the base wireless power charging system 202 and electric vehicle charging system 214 are minimal when the electric vehicle power transfer element 216 is located in the near-field coupling mode region of the base power transfer element 204.

Efficient energy transfer occurs by transferring energy via a magnetic near-field rather than via electromagnetic waves in the far field, which may involve substantial losses due to radiation into the space. When in the near-field, a coupling mode may be established between the transmit power transfer element and the receive power transfer element. The space around the power transfer elements where this near-field coupling may occur is referred to herein as a near-field coupling mode region.

While not shown, the base power converter 236 and the electric vehicle power converter 238, if bidirectional, may include for the transmit mode an oscillator, a driver circuit such as a power amplifier, and for the receive mode a rectifier circuit. The oscillator may be configured to generate a desired operating frequency, which may be adjusted in response to an adjustment signal. The oscillator signal may be amplified by a power amplifier with an amplification amount responsive to control signals. For the receive mode, the base power converter 236 and the electric vehicle power converter 238 may also include a rectifier and switching circuitry.

A resonant frequency may be based on the inductance and capacitance of a resonant circuit comprising a power transfer element (e.g., the base power transfer element 204) and a compensation network (e.g., compensation network 206) as described above. As shown in FIG. 2, inductance may generally be the inductance of the power transfer element, whereas, capacitance may be added to the compensation network to create a resonant structure with base power transfer element 204 at a desired resonant frequency. Accordingly, for larger size power transfer elements using larger diameter coils exhibiting larger inductance, the value of capacitance needed to produce resonance may be lower. Inductance may also depend on a number of turns of a coil. Furthermore, as the size of the power transfer element increases, coupling efficiency may increase. This is mainly true if the size of both base and electric vehicle power transfer elements increase. Furthermore a resonant circuit comprising a power transfer element and a compensation network may be designed to have a high quality (Q) factor to improve energy transfer efficiency. For example, the Q factor may be 300 or greater.

Figure 3:
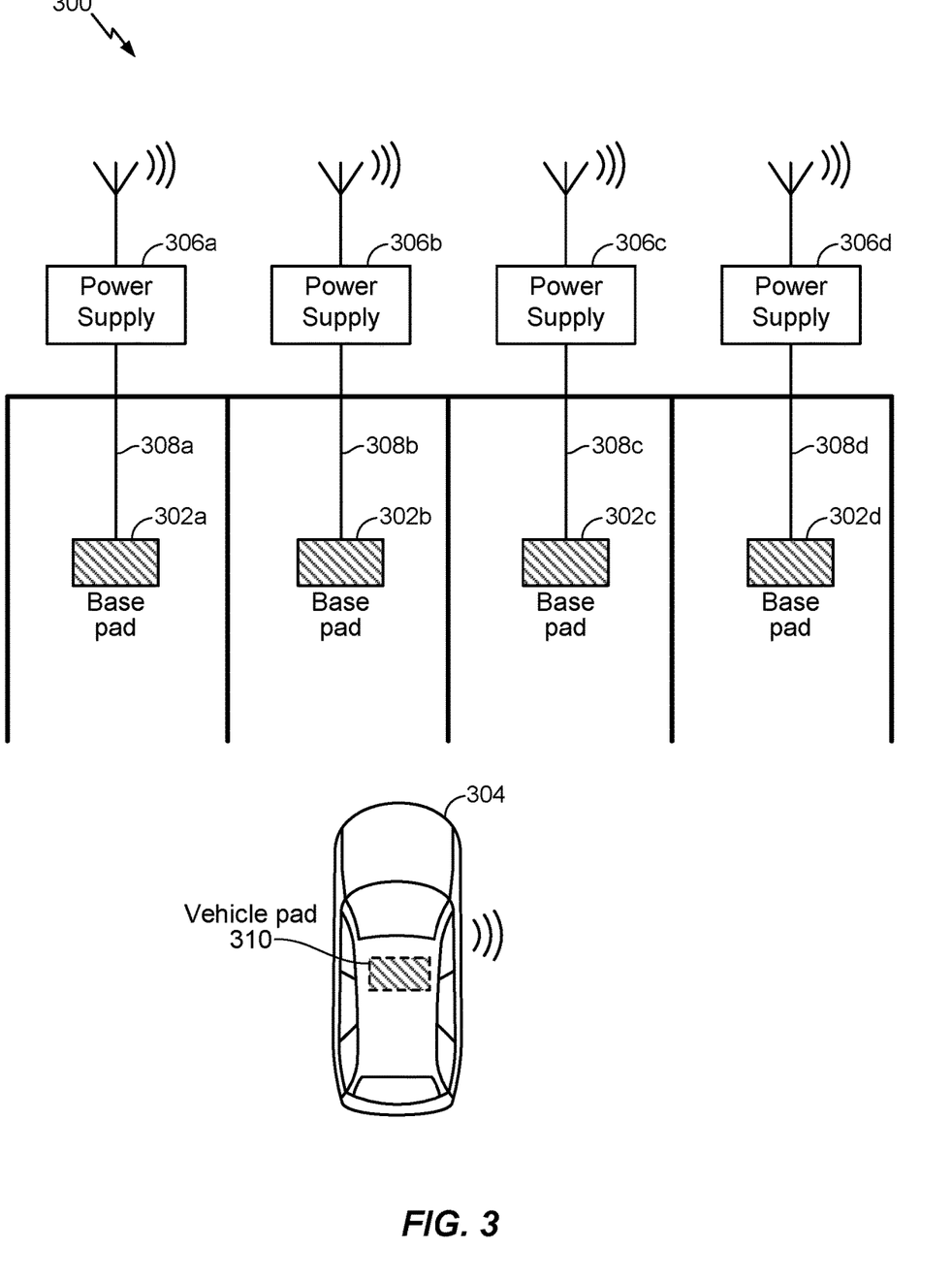
FIG. 3 illustrates exemplary feed lines with integrated filtering in accordance with certain aspects of the present disclosure.

FIG. 3 illustrates an example car-park environment 300 employing a WEVC system in which aspects of the present disclosure may be practiced. A plurality of wireless power transfer pads 302 are distributed throughout the environment 300, for example, in different parking spots. The wireless power transfer pads 302 may be used to wirelessly charge electric vehicles, such as electric vehicle 304. In certain aspects, a wireless power transfer pad 302 is connected to a power supply 306 through a feed line 308. In certain aspects, feed lines 308 include integrated filtering in accordance with the disclosure. The wireless power transfer pads 302 may deliver power wirelessly to the electric vehicle 304, for example, using one or more techniques described herein. According to aspects, a wireless power transfer pad 310 on the electric vehicle 304 may receive the wirelessly transmitted power and may store the power in a battery (not shown). In some cases, power supplies 306 may communicate with each other to coordinate the wireless transmission of power. In some cases, power supplies 306 communicate with each other over a hardwire cable (not shown) or via one or more antennas. In yet other cases, a wireless power transfer device may comprise wireless power transfer pads 302(a-d) connected to a single power supply (e.g., power supply 306a) though a plurality of feed lines with integrated filtering (not shown).

In certain aspects, the WEVC system illustrated in the large scale car park environment 300 may be employed in a semi-dynamic or dynamic system. In such a system, multiple wireless power transfer pads may be disposed within a street and may be used to power the electric vehicle 304 as the electric vehicle 304 drives along the street. For example, to power the electric vehicle 304, the WEVC system may dynamically activate wireless power transfer pads as the electric vehicle 304 passes over, allowing each of these wireless power transfer pads to couple with the electric vehicle 304 and wirelessly transmit power. It will be appreciated that a complex wireless power transfer device such as the one described above with dynamically activated wireless power transfer pads are within the scope of this disclosure.

Figure 4A:
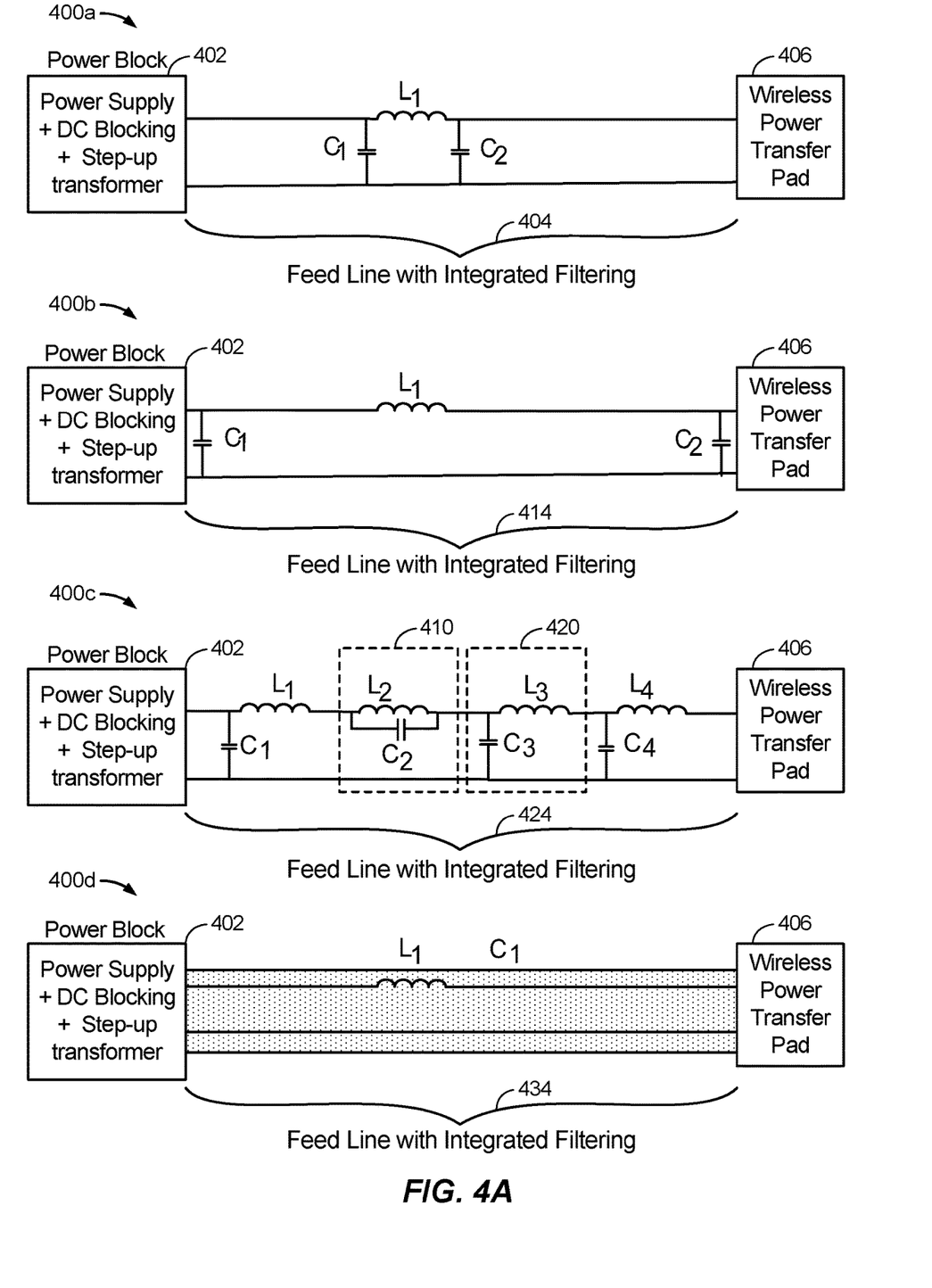
FIGS. 4A and 4B illustrate exemplary feed lines with integrated filtering in accordance with certain aspects of the present disclosure.

FIG. 4a illustrates wireless power transfer devices 400 (a-d) in accordance with certain aspects of the disclosure. Wireless power transfer device 400a includes power block 402, feed line 404, and wireless power transfer pad 406. As discussed above, the location of the feed line 404 is located between components power block 402 and wireless power transfer pad 406 and may allow for reduced complexity and/or size of power block 402 and wireless power transfer pad 406 in addition to attenuating unwanted frequencies (e.g., harmonics, non-sinusoidal currents, voltages, and etc.) that may reduce system efficiency (e.g, hysteresis, eddy current losses, and etc.). Feed line 404 comprises a CLC configuration (or pi filter) that can be located anywhere along feed line 404. It will be appreciated that other filter topologies (e.g., LC, LCL, SS, SP, PS, PP, etc.) may be used within the scope of the disclosure. It will be further appreciated that other ferromagnetic materials (e.g., materials with a relative permeability greater than 1) may also be added to a feed line (e.g., feed line 404). The serial inductance of the pi filter is obtained from the parasitic inductance that may be in feed line 404 during operation of wireless power transfer device 400a. Thus, in certain aspects if the inductance of the feed line is (L1) (to which additional inductance can be added if desired and/or alter the properties of the conductors), then the design of a filter may be written in terms of the cutoff frequency fc as $C_p=1/(8\pi^2 f_c^2 L_s)$. The choice of fc is determined by the desired attenuation range of higher frequencies. In certain aspects, feed line 404 is provides greater attenuation at higher frequencies (e.g., frequencies above about 1.5 MHz).

Figure 5:
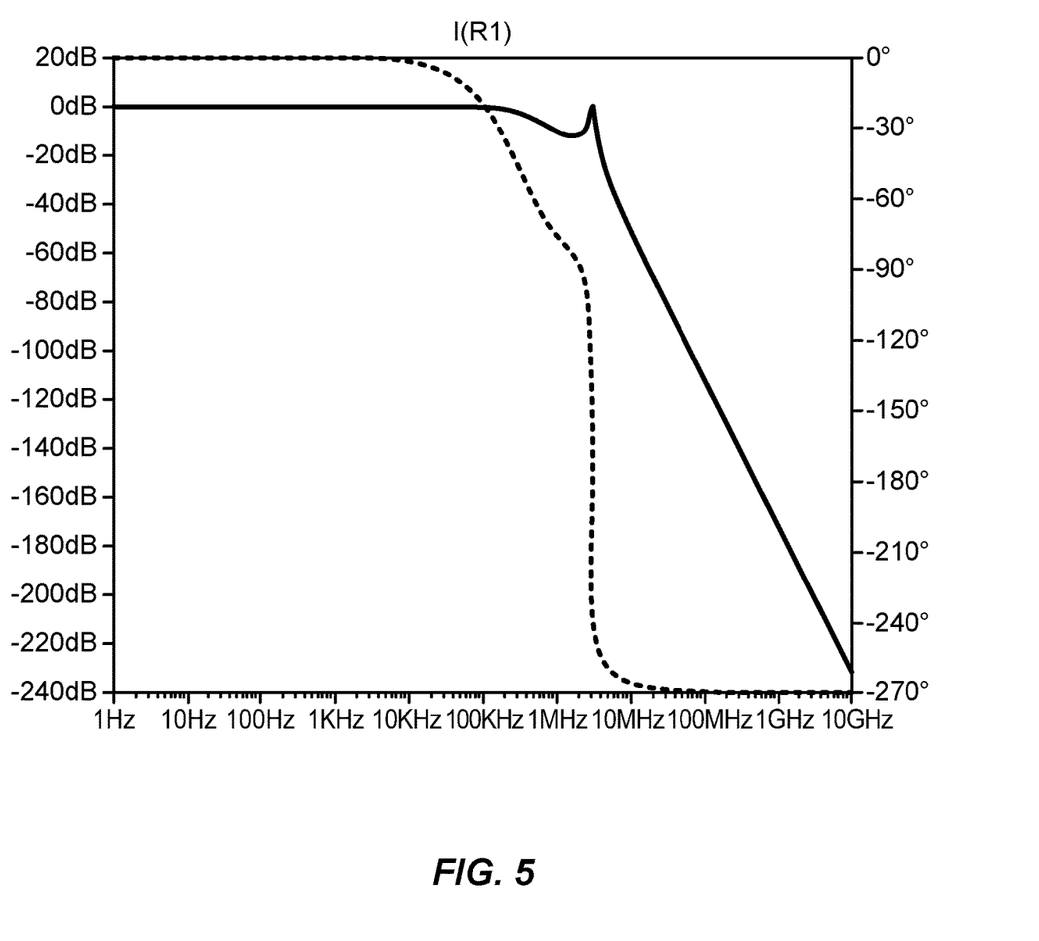
FIG. 5 shows a spectral analysis of a wireless power transfer device in accordance with certain aspects of the present disclosure.

FIG. 5 shows a frequency response graph of a feed line with integrated filtering (e.g., feed line 404, in FIG. 4a) in a wireless power transfer device (e.g., configured to attenuate frequencies above 1.5 MHz, which is a good selection for a driving signal at an 85 kHz frequency, which is a typical driving signal frequency used for driving a wireless power transfer pad in a WEVC system) in accordance with certain aspects of the disclosure. FIG. 5 shows minimal attenuation at about 85 kHz and greater attenuation above 85 kHz. In certain aspects, the feed line with integrated filtering depicted in FIG. 5 is configured to attenuate frequencies above 85 kHz using a cutoff frequency of 1.5 MHz. It will be appreciated that frequencies below 85 kHz may also experience attenuation without deviating from the scope of this disclosure. It will be further appreciate that a feed line with integrated filtering may be configured to attenuate unwanted frequencies below 85 kHz or a range of frequencies (e.g. filtering out both below a cutoff frequency and above a cutoff frequency, and etc.).

Returning to FIG. 4a, in certain aspects, power block 402 comprises a compensation network employing a compensation strategy (e.g., LC, LCL, SS, SP, PS, PP, etc.). In certain aspects, the compensation network is located inside a wireless power transfer pad 406 without deviating from the scope of the disclosure. Thus, it will be appreciated that a compensation network may be located in either a power block or a wireless power transfer pad 406.

Wireless power transfer device 400a operates wireless power transfer pad 406 at about 85 kHz, but other driving signal frequencies may be used without deviating from the scope of the disclosure. In certain aspects, unwanted frequencies maybe a frequency, or a range of frequencies, at or under 300 kHz. In other aspects, unwanted frequencies maybe a frequency, or a range of frequencies, at or above 300 kHz. Thus, it will be appreciated that wireless power transfer devices 400 can be configured to have a feed line with integrated filtering to attenuate certain frequencies.

Figure 6A:
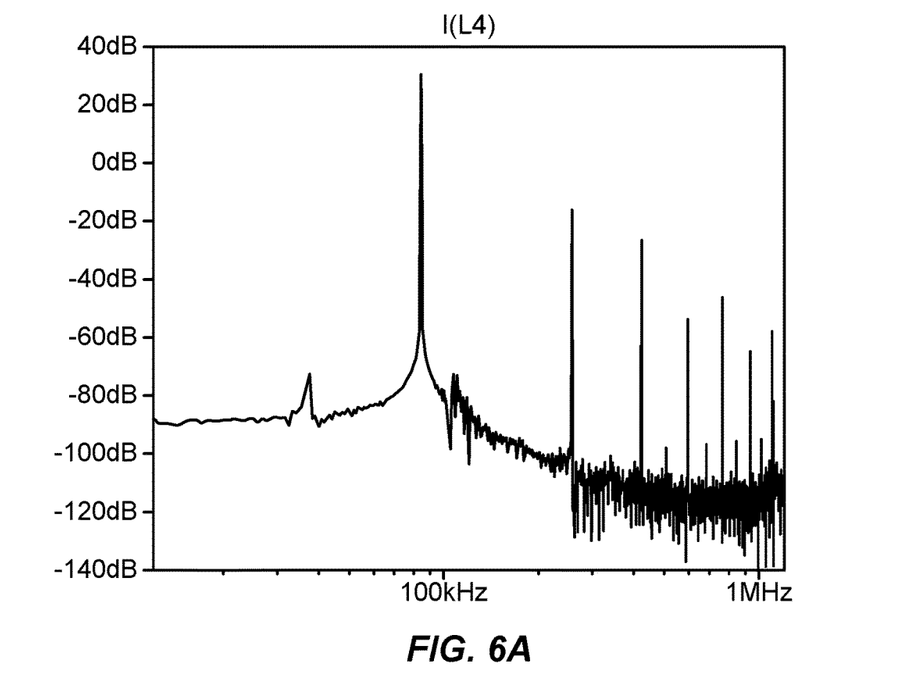
FIGS. 6a and 6b show spectral analysis of a wireless power transfer device in accordance with certain aspects of the present disclosure.
Figure 6B:
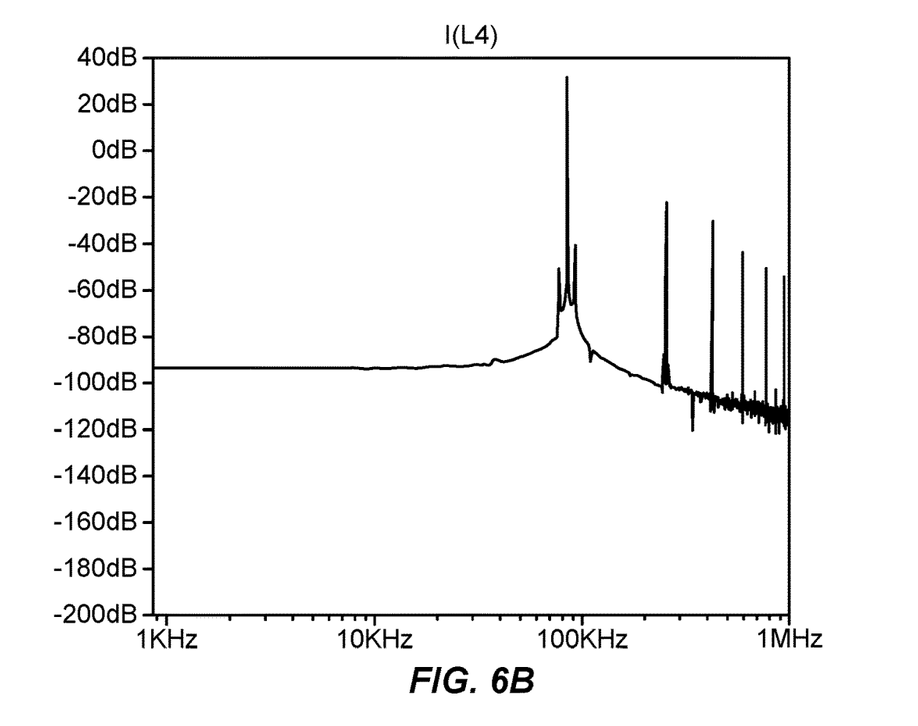

FIG. 6a shows a spectral analysis of a wireless power transfer device with a feed line without integrated filtering. FIG. 6b shows a spectral analysis of a wireless power transfer device including a feed line with integrated filtering. As shown in FIGS. 6a and 6b, unwanted frequencies are filtered (e.g., FIG. 6b shows attenuation compared to FIG. 6a of unwanted frequencies above about 85 kHz) in accordance with certain aspects of the disclosure. It will be appreciated a wireless power transfer device with a feed line with integrated filtering (e.g., wireless power transfer device depicted in FIG. 6b) may have improved system efficiency (e.g., hysteresis, eddy current losses, and etc.) compared to a feed line without integrated filtering (e.g., wireless power transfer device depicted in FIG. 6a).

Returning to FIG. 4a, a wireless power transfer device 400b includes a feed line 414 comprising a split pi-filter where C1 and C2 are located at opposite ends of the feed line. In certain aspects, feed line 414 may be configured with C1 and C2 anywhere in feed line 404, including and up to placing C1 (e.g., one or more capacitors) as the last component of feed line 414 and before the first component of power block 402. In certain aspects, feed line 414 may be configured with C1 and C2 anywhere in feed line 404, including and up to placing C2 (e.g., one or more capacitors) as the last component of feed line 414 and before the first component of a wireless power transfer pad 406. In certain aspects, C1 and C2 in 400b may be integrated into a connection unit (e.g., plug, connector, cap, cover, and etc.) connecting a feed line 414 to a power block 402 or a wireless power transfer pad 406. In other aspects in C1 may be about equal C2. In other aspects, the total capacitance represented by C1 is substantially greater or substantially less than C2.

FIG. 4a shows wireless power transfer device 400c including a feed line 424 comprising a segmented filtering strategy (e.g., notch filtering). In certain aspects, feed line 424 may be made of segments, for example, segment 410 is a segment that includes inductor L2 and capacitor C2, and segment 420 is a segment that includes inductor L3 and capacitor C3 are each a segment. In certain aspects, segments may be added (e.g., to remove filtering or make a feed line shorter). To add additional inductance or capacitance to feed line 424, it will be appreciated that additional segments (not shown) may be added into feed line 424. Feed line 424 further includes capacitors C1 and C4 and inductors L1 and L4. It will be appreciated in certain aspects the total desired capacitance is divided into at least one or more segments and the total desired inductance is divided into at least one or more segments. In certain aspects, the total inductance of feed line 424 is $L_{TOTAL}=L1+L2+L3+L4$. In certain aspects, the selection of each segmented capacitance may be $C_n=1/(4\pi^2 L_n f_n^2)$. In certain aspects, each segment may include filtering for a certain frequencies and/or range of frequencies (or notch filters) (e.g., segment 410 may filter frequencies above 85 kHz, and segment 420 may filter frequencies below 60 kHz. It will be further appreciated that segments 410 and 420 may each comprise different filtering strategies (e.g., LC, LCL, SS, SP, PS, PP, and etc.)

FIG. 4a further shows wireless power transfer device 400d including a power block 402, a feed line 434, and a wireless power transfer pad 406. Feed line 434 uses at least one filtering material (e.g., a dielectric (e.g., polyethylene, teflon, polyvinyl chloride (PVC), polypropylene, and etc.), smart material (e.g., a material that can change capacitance), and etc.) integrated into the feed line 406 as a capacitance component. Thus, in certain aspects, feed line 434 includes integrated filtering by using the inductance of the feed line and the capacitance of at least one filtering material, such as a dielectric. It will be further appreciated the at least one filtering material may be a smart material which may be used as a dynamic capacitor to change filtering properties in the feed line when electrical properties of the feed line change (e.g., more or less current, change of frequency, additional frequencies, and etc.). It will be appreciated that the filtering material may be integrated in to feed line 434 in a number of ways (e.g., covering each conductor core individually (e.g., feed line 434 in FIG. 4b), covering each conductor core together (e.g., feed line 434 in FIG. 4a), using one or more layers of one or more filtering materials, and/or including filtering material into the feed line in any other manner to generate a capacitance in accordance with the disclosure.

Figure 4B:
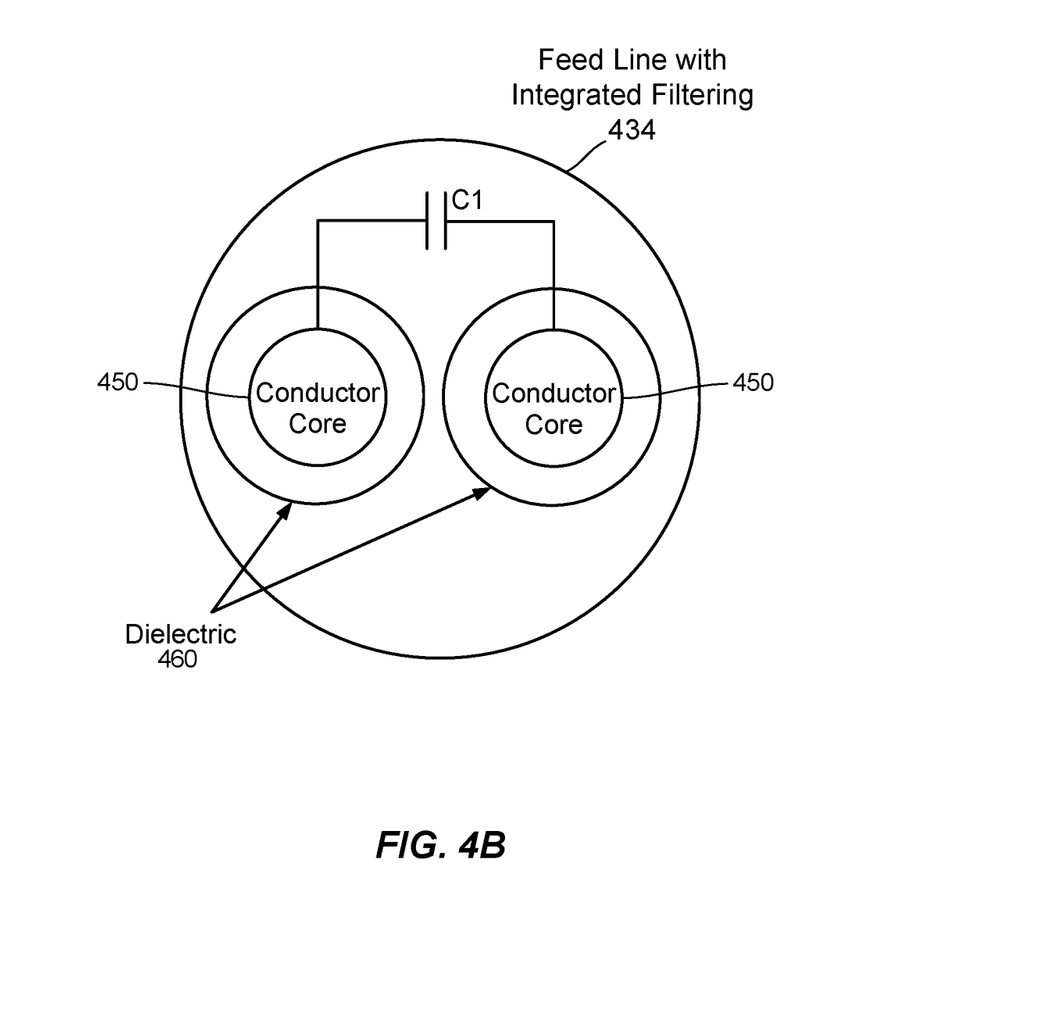

FIG. 4b show shows a cross section of a variation of feed line 434 from wireless power transfer device 400d in FIG. 4a. As shown in FIG. 4b, feed line 434 comprises conductor cores 450 (e.g., copper, aluminum, silver, gold or another suitable conductor) for transferring power from a power block 402 to a wireless power transfer pad 406 as shown in FIG. 4a. As shown in FIG. 4b, conductor cores are located inside a filtering material which is a dielectric 460 (e.g., polyethylene, teflon, polyvinyl chloride (PVC), polypropylene, and etc.). It will be appreciated that each conductor core 450 may be a single wire, multiple wires of the same type, or multiple wires of different types. It will be appreciated that the dielectric 460 may encapsulate each conductor core individually, or the dielectric 460 may encapsulate both conductor cores together. It will be further appreciated that other wires that may also be capsulated in dielectric 460. In certain aspects, feed line 434 in FIG. 4b comprises additional filtering components (e.g., for example capacitor C1)

Figure 7:
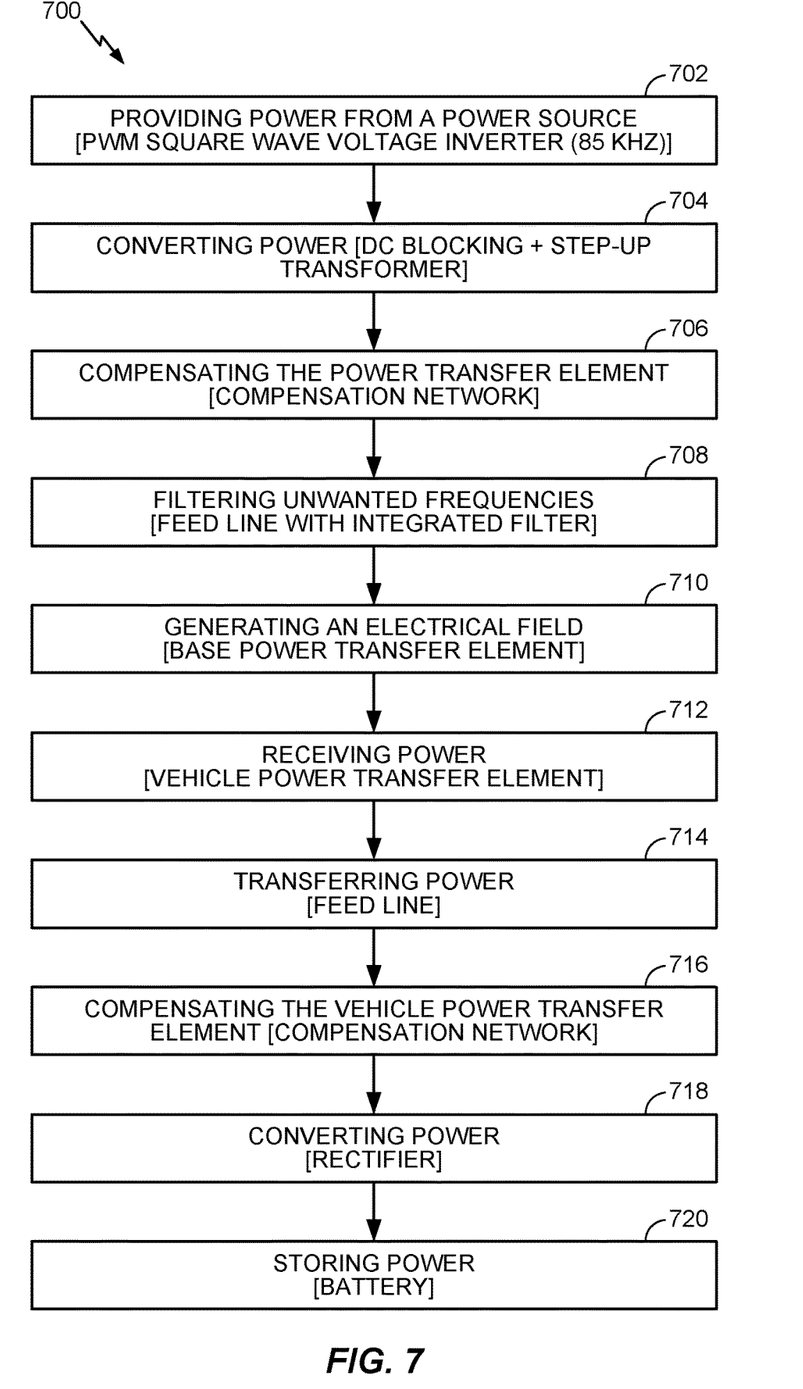
FIG. 7 is a block diagram showing exemplary components of a wireless power transfer system in accordance with certain aspects of the present disclosure.

FIG. 7 is a process flow diagram of filtering power in a wireless power transfer device (e.g., wireless power transfer device 400, FIG. 4) in accordance with aspects of the disclosure. Process 700 begin at 702 where a PWM square wave voltage inverter is configured to produce a driving signal, as a square wave, with a frequency of 85 kHz to perform the step of providing power from a power source. According to certain aspects, selecting a power source and/or a driving signal frequency is done based on industry standards, but any power source suitable for producing a driving signal for producing usable power at a base power transfer element 710 may be used without deviating from the scope of the disclosure. At step 704, DC blocking circuitry and step up transformer perform the step of converting the power received from the power source. At step 706, a compensation network performs the step of compensating the power transfer element. At step 708, feed line with integrated filtering performs the step of filtering unwanted frequencies. At step 710, the base power transfer element performs the step of generating an electrical field to transfer power to the vehicle power transfer element that performs the step of receiving power at step 712. At step 714, a feed line performs the step of transferring power to the compensation network that compensates the vehicle power transfer element at step 716. At step 718, a rectifier performs the step of converting power to store in a battery at step 720.

In certain aspects, the order of operation is reversed, and power is transferred from a battery to a power source. In certain aspects, both feed lines 708 and 714 include integrated filtering within the scope of this disclosure. In certain aspects, the selection of filtering components in feed line 708 (e.g., to attenuate an unwanted frequency and/or range of frequencies) is based at least in part on the operations and components in steps 702 through 710. In certain aspects, the selection of filtering components in feed line 708 is based at least in part on the operations and components in elements 702 through 720, or 712 to 720. In certain aspects, the selection of what frequency to filter with feed line 708 is based at least in part on more or more components in process 700 (e.g., the selection of filtering components in feed line 708 may be based only on a driving signal frequency (e.g., 85 kHz)).

Figure 8:
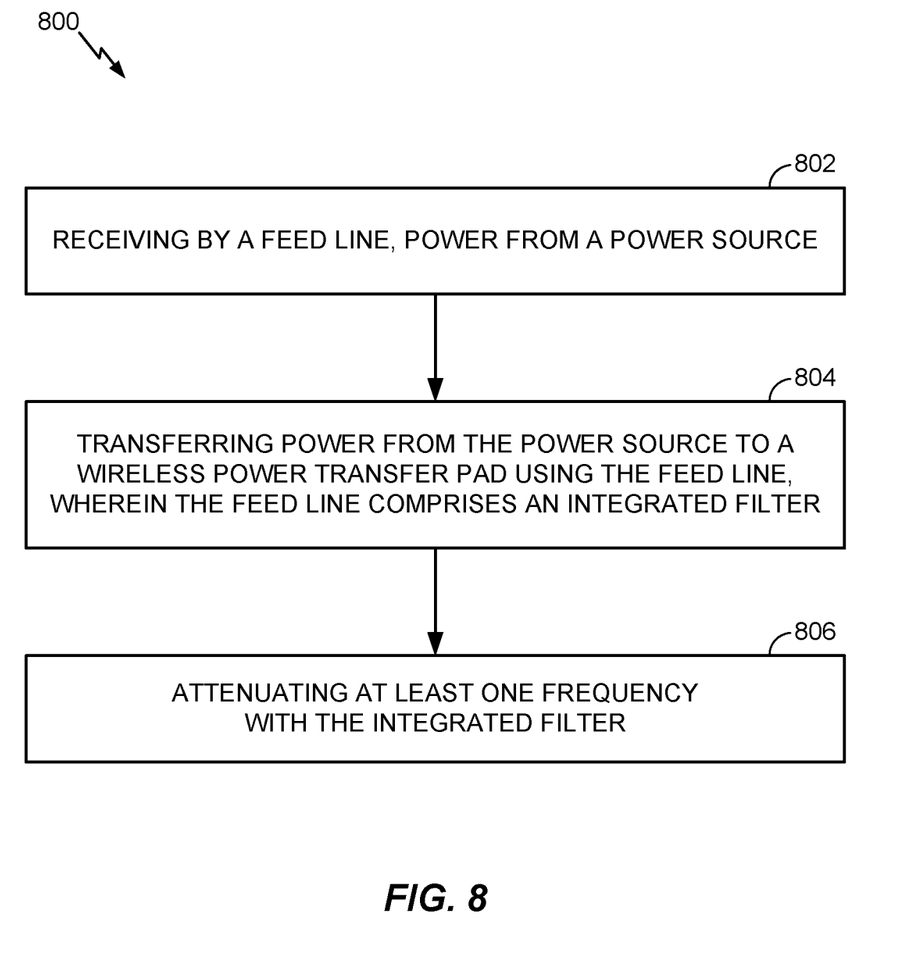
FIG. 8 illustrates a method of attenuating a frequency in a wireless power transfer system.

FIG. 8 illustrates a method of attenuating at least one frequency in a wireless power transfer system 800 using a feed line with integrated filtering in accordance with certain aspects of the disclosure. The method includes receiving by a feed line, power from a power source at step 802. The method further includes transferring power from the power source to a wireless power transfer pad using the feed line, wherein the feed line comprises an integrated filter at step 804. The method further includes attenuating at least one frequency with the integrated filter step 806.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for determining a target frequency may mean running computer simulations based in part on the wireless power transfer device.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A feed line for filtering unwanted frequencies in a wireless power transfer system, the feed line comprising:
   a feed line for filtering unwanted frequencies in a wireless power transfer system, the feed line comprising:
      a first end, wherein the first end is configured to connect to a power source that generates a driving signal having a driving signal frequency;
      a second end, wherein the second end is configured to connect to a wireless power transfer element configured to wirelessly transmit power;
      at least one conductor core, wherein the conductor core is configured to transfer the driving signal from the power source to the wireless power transfer element;
      an integrated filter configured to attenuate at least one frequency generated by the wireless power transfer system, wherein the integrated filter comprises at least one inductor and at least one capacitor; and
      a plurality of segments comprising a first segment and a second segment, wherein the first segment comprises the integrated filter, and wherein the second segment comprises a second integrated filter configured to attenuate at least one second frequency generated by the wireless power transfer system, wherein the second integrated filter comprises a second inductor and a second capacitor.

2. The feed line of claim 1, wherein the at least one inductor comprises the at least one conductor core.

3. The feed line of claim 2, wherein the at least one inductor further comprises a second inductor, wherein the second inductor is a ferromagnetic material.

4. The feed line of claim 1, wherein the at least one frequency is at least one harmonic of the driving signal frequency.

5. The feed line of claim 1, wherein the inductor and the capacitor comprise a Pi filter.

6. The feed line of claim 1, wherein the at least one capacitor is located at one of the first end or the second end.

7. The feed line of claim 1, wherein the at least one capacitor comprises a capacitor at the first end and a capacitor at the second end.

8. The feed line of claim 1, wherein the at least one capacitor comprises a dielectric material, wherein the at least one inductor comprises the at least one conductor core, and wherein the at least one conductor core passes through the dielectric material.

9. The feed line of claim 1, wherein attenuating the at least one second frequency generated by the wireless power transfer system and attenuating the at least one frequency generated by the wireless power transfer system are both attenuating the same frequency.

10. A wireless power transmitter system for filtering unwanted frequencies in a wireless power transfer system, the wireless power transmitter comprising:
    a power source that generates a driving signal having a driving signal frequency; and
    a feed line connected to the power source at a first end, the feed line comprising:
       at least one conductor core;
       an integrated filter configured to attenuate at least one frequency generated by the wireless power transfer system when a wireless power transfer element is coupled to a second end of the feed line, wherein the integrated filter comprises at least one inductor and at least one capacitor; and
       a plurality of segments including:
          a first segment comprising the integrated filter, and
          a second segment comprising a second integrated filter configured to attenuate at least one second frequency generated by the wireless power transfer system, wherein the second integrated filter comprises a second inductor and a second capacitor.

11. A wireless power transmitter system of claim 10, wherein the at least one inductor comprises the at least one conductor core.

12. A wireless power transmitter system of claim 10, wherein the inductor and the capacitor comprise a Pi filter.

13. A wireless power transmitter system of claim 10, wherein the at least one capacitor comprises a dielectric material, wherein the at least one inductor comprises the at least one conductor core, and wherein the at least one conductor core passes through the dielectric material.

14. A wireless power transmitter system of claim 10, wherein the at least one capacitor comprises a capacitor at the first end.

15. A wireless power transmitter system of claim 10, wherein the at least one capacitor comprises a capacitor at the second end.

16. A wireless power receiver system for filtering unwanted frequencies in a wireless power transfer system, the wireless power receiver system comprising:
   a wireless power transfer element configured to wirelessly transmit power when driven by a power source that generates a driving signal having a driving signal frequency; and
   a feed line connected to the wireless power transfer element at a first end, the feed line comprising:
      at least one conductor core;
      an integrated filter configured to attenuate at least one frequency generated by the wireless power transfer system, wherein the integrated filter comprises a first inductor and a first capacitor; and
      a plurality of segments including:
         a first segment comprising the integrated filter; and
         a second segment comprising a second integrated filter configured to attenuate at least one second frequency generated by the wireless power transfer system, wherein the second integrated filter comprises a second inductor and a second capacitor.

17. A wireless power receiver system of claim 16, wherein the first inductor comprises the at least one conductor core.

18. A wireless power receiver system of claim 16, wherein the first capacitor comprises a dielectric material, wherein the first inductor comprises the at least one conductor core, and wherein the at least one conductor core passes through the dielectric material.

19. A wireless power receiver system of claim 16, wherein the first capacitor comprises a capacitor at the first end.

20. A wireless power receiver system of claim 16, wherein attenuating the at least one second frequency generated by the wireless power transfer system and attenuating the at least one frequency generated by the wireless power transfer system are both attenuating the same frequency.

* * * * *